United States Patent

[11] 3,622,812

[72] Inventor Robert H. Crawford
Richardson, Tex.
[21] Appl. No. 758,201
[22] Filed Sept. 9, 1968
[45] Patented Nov. 23, 1971
[73] Assignee Texas Instruments Incorporated
Dallas, Tex.

[54] BIPOLAR-TO-MOS INTERFACE STAGE
4 Claims, 13 Drawing Figs.

[52] U.S. Cl. .......... 307/303, 317/235 R, 307/304, 317/234 R, 317/235 D, 317/235 B, 317/235 G, 317/235 Y

[51] Int. Cl. .......... H01l 19/00

[50] Field of Search .......... 317/235, 21.1, 40.1, 22.2, 40.12, 235 D; 307/303, 304

[56] References Cited

UNITED STATES PATENTS

| | | | |
|---|---|---|---|
| 3,504,293 | 3/1970 | Lin | 330/35 |
| 3,448,293 | 6/1969 | Russell | 307/251 |
| 3,401,319 | 9/1968 | Watkins | 317/235 |
| 3,445,734 | 5/1969 | Pecoraro | 317/235 |
| 3,454,785 | 7/1969 | Norman et al. | 307/221 |
| 3,408,544 | 10/1968 | Teszner | 317/235 |
| 3,404,450 | 10/1968 | Karcher | 29/577 |

OTHER REFERENCES

Electronic Circuit Theory. Zimmermann and Mason, Chapman and Hall, Limited N.Y. 1959 p. 184– 187

Electronics Review Vol. 41, No. 22 Oct. 28, 1968 pp. 49–50

*Primary Examiner*—John W. Huckert
*Assistant Examiner*—B. Estrin
*Attorneys*—Samuel M. Mims, Jr., James O. Dixon, Andrew M. Hassell, Harold Levine, Melvin Sharp, Gerald B. Epstein and John E. Vandigriff

ABSTRACT: An interface stage on an MOSFET-integrated logic circuit for shifting the positive output voltage of a bipolar logic circuit to the negative input voltage of an MOSFET logic circuit comprised of a bipolar transistor the emitter of which is connected to the output of the bipolar logic circuit, the base of which is grounded, and the collector of which is connected through a resistance to the negative drain supply voltage and to the logic input of the MOSFET logic circuit. The bipolar transistor is a surface oriented transistor formed by two spaced P-type diffusions made on the same N-type substrate by the same diffusion step used to form the source and drain diffusions of the MOSFETs. The bipolar transistor can also be used as an MOSFET with the provision of a gate electrode, and in this configuration provide an inhibit logic function and serve as an alternative input for the negative logic voltage from another MOSFET circuit.

INVENTOR:

ROBERT H. CRAWFORD

E Mickey Hubbard

ATTORNEY

INVENTOR:

ROBERT H. CRAWFORD

E. Mickey Hubbard

ATTORNEY

BIPOLAR-TO-MOS INTERFACE STAGE

This invention relates generally to semiconductor devices, and more particularly relates to bipolar and MOSFET integrated circuits.

MOS transistors have the advantages of very high impedances and high-packing density when compared with bipolar integrated logic circuits. However, these devices are not used as widely as might otherwise be expected because of their inherent incompatability with bipolar devices. The logic levels for a metal-oxide-semiconductor field effect transistor (MOSFET) circuit are typically −2.0 and −12.0 volts, while the logic levels for a bipolar logic circuit are typically +0.2 and +3.0 volts. This necessitates an interfacing circuit any time that an MOS logic circuit is to be driven by a bipolar logic circuit.

This invention is concerned with an interface stage for transposing the positive voltage of bipolar circuits to the negative voltages of MOS logic circuits. The interface stage comprises a bipolar transistor connected in common base configuration with the emitter connected to the output of the bipolar circuit and the collector connected to the input of the MOS circuit and through a resistance to a negative voltage supply. In accordance with a specific aspect of the invention, the interfacing transistor is a surface-oriented transistor comprised of a pair of spaced-diffused regions formed on the MOS-integrated circuit chip using the same diffusion step used to fabricate the MOS transistors of the logic circuit. In addition, the interface stage uses the same bias voltages required for the MOS logic circuit. The positive logic outputs from the bipolar logic circuits may be applied directly to the interface stage. In addition, the interfacing device has the capability of performing an inhibit function merely by providing a conventional MOS control gate, and the latter embodiment of the invention may also be utilized as an inverting input for the logic output from another MOS logic circuit.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
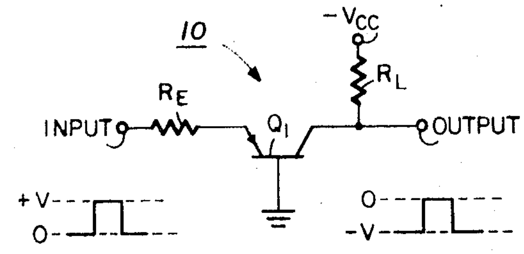
FIG. 1 is a schematic circuit diagram of the interface stage in accordance with the present invention.

Referring now to the drawings, and in particular to FIG. 1, an interface stage in accordance with the present invention is indicated generally by the reference numeral 10. The interface stage 10 is comprised of a bipolar transistor $Q_1$. The emitter of transistor $Q_1$ is connected through an emitter resistance $R_E$ input and may be considered the input. The resistance $R_E$ may be external to the circuit, or may be in the output of the circuit providing the input voltage. The base of transistor $Q_1$ is grounded and the collector is connected through a load resistor $R_L$ to a negative voltage supply $-V_{CC}$. The junction between the collector and the load resistor $R_L$ is the output.

In operation, when the input is at 0.0 volt, i.e., ground potential, no emitter current flows and transistor $Q_1$ is turned "off". As a result, the output approaches the negative potential of the supply voltage $-V_{CC}$, depending upon the input impedance of the circuit to which the output is coupled. When the input goes positive with respect to ground, the emitter-based junction of transistor $Q_1$ is forward biased, resulting in emitter current. Because of the emitter current, current also flows in the collector in accordance with the equation $I_C \simeq I_E$, where $\alpha$ is the common base forward current gain. When $Q_1$ saturates, the output approaches ground potential. As a result of a swing from ground to +4.0 volts in the positive input voltage, for example, the output voltage would swing from −12.0 volts to ground. It will be noted that the voltage swings are transposed with respect to ground without being inverted. It will be noted that the positive input voltages to the interface stage 10 are in the range typically associated with bipolar logic circuits, while the negative output signal is in the range useful in MOSFET logic circuits.

Figure 2:
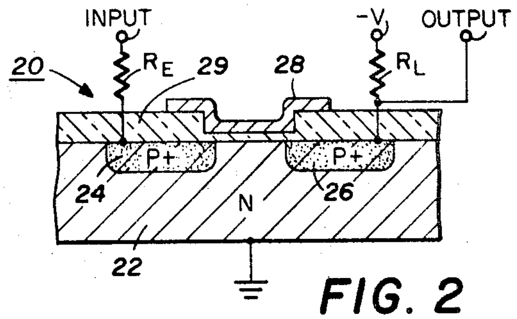
FIG. 2 is a simplified sectional view of a device embodying the circuit of FIG. 1.

The interfacing stage 10 can be implemented by the device indicated generally by the reference numeral 20 in FIG. 2. The device 20 includes a relatively high resistivity N-type substrate 22 of the type generally used as the substrate for an MOS-integrated logic circuit, and two spaced, relatively heavily doped P-type regions 24 and 26, which may have the same doping levels as that customarily used to form the source and drain diffusions of an MOS transistor. A conventional gate electrode 28 may be provided over an area between the diffused regions 24 and 26 where the layer of oxide insulation 29 is then for the purposes which will hereafter be described in detail. The emitter resistor $R_E$ and the load resistor $R_L$ may both be external to the device. A device in which the diffusions 24 and 26 were spaced approximately 0.2 mils apart for a length of about 2 mils had the operating characteristic represented by curves shown in FIGS. 3 and 4. From these curves it will be noted that the common base $\alpha$ is approximately 0.28 with a collector current of −1.0 ma. and a collector-base voltage of −10.0 volts.

Figure 5:
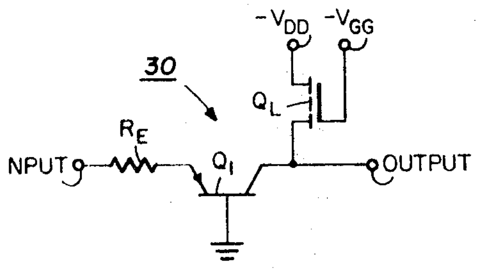
FIG. 5 is a schematic circuit diagram of another embodiment of the interface stage in accordance with the present invention.

Another interface stage in accordance with the present invention is indicated generally by the reference numeral 30 in FIG. 5. The interface stage 30 is identical to the interface stage 10 except that the load resistor $R_L$ is replaced by an MOS transistor $Q_L$. The gate of transistor $Q_L$ is connected to a negative bias voltage $-V_{GG}$ and the drain is connected to a negative voltage source $-V_{DD}$ selected to provide the desired resistance value. The interface stage 30 operates in the same manner as interface stage 10. However, the use of the transistor $Q_L$ for the load makes the interface stage highly amenable to fabrication in an MOS-integrated circuit.

Figure 6:
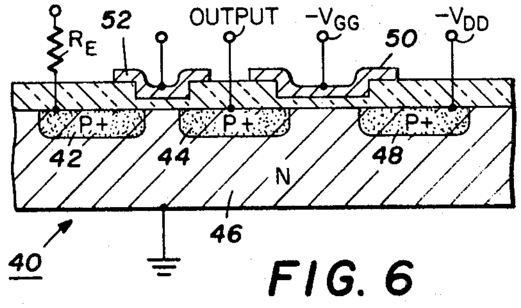
FIG. 6 is a schematic sectional view illustrating a device incorporating the circuit of FIG. 5.

A device incorporating the interface stage 30 is indicated generally by the reference numeral 40 in FIG. 6. The bipolar transistor $Q_1$ is formed by P-type diffusions 42 and 44 in an N-type substrate 46. The load transistor $Q_l$ is formed by diffusion 44, a third diffusion 48, and a gate electrode 50. The emitter resistor $R_E$ is external to the device, and is typically in the output circuit of the device providing the input signal. It is also convenient to provide the bipolar transistor with a gate electrode 52 so that it can be used as either a bipolar transistor or a field effect transistor, for purposes which will hereafter be described in greater detail. The bipolar transistor and the MOS transistor may be fabricated simultaneously on the same semiconductor substrate using the same processing steps.

Figures 7, 8:
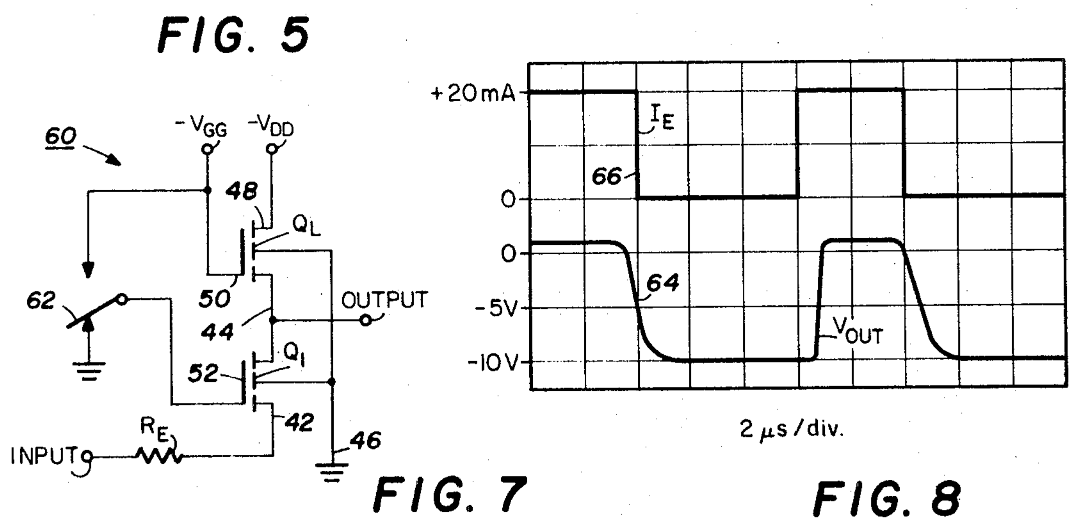
FIG. 7 is a schematic circuit diagram of still another embodiment of the interface stage in accordance with the present invention.
FIG. 8 is a plot of waveforms which illustrate one mode of operation of the circuit of FIG. 7.
Figure 9:
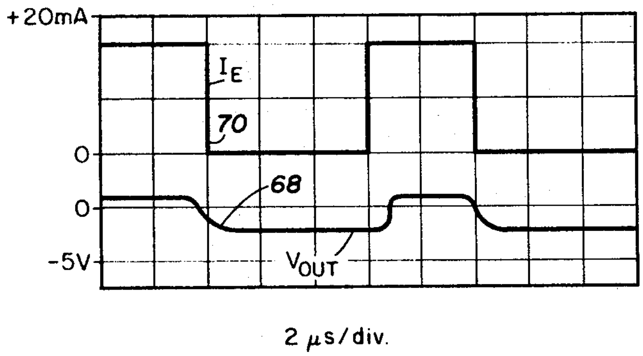
FIG. 9 is a plot of waveforms which illustrate another mode of operation of the circuit of FIG. 7.

The device 40 can also be represented by the schematic circuit diagram 60 of FIG. 7 wherein corresponding parts are designated by the same reference characters. When the gate electrode 52 of transistor $Q_1$ is connected to ground, as represented by the position of switch 62, the voltage at the output is represented by the curve 64 in FIG. 8 in response to an input current represented by the curve 66. Thus, it will be noted that the output voltage substantially follows the input current, except that the output voltage swings from substantially zero to a negative voltage as the input current swings from a positive current to zero. When the switch 62 is thrown to connect the gate electrode 52 of transistor $Q_1$ to the negative gate bias voltage $-V_{GG}$, the output voltage is inhibited from swinging as shown by the output voltage curve 68 in FIG. 9 which is produced in response to the input current represented by curve 70. The gate bias voltage $-V_{GG}$ is typically about −12.0 volts. Thus, it will be noted that the output remains at the logic level represented by zero potential and the interfacing transistor $Q_1$ performs an inhibited logic function.

Figure 11:
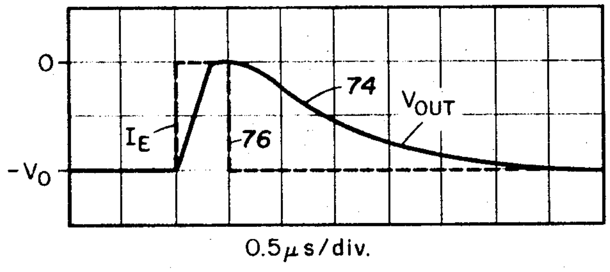
FIG. 11 is a plot of the output waveform from the circuit of FIG. 10 when operated in one mode.
Figure 10:
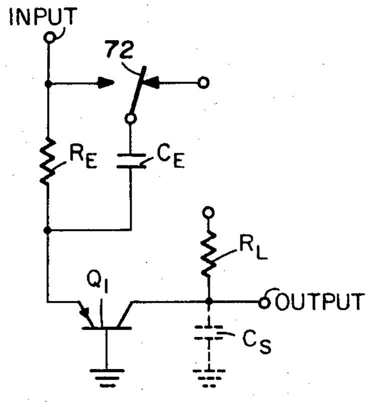
FIG. 10 is a schematic circuit diagram of a circuit used to test the response time of the interface stage in accordance with the present invention.
Figure 12:
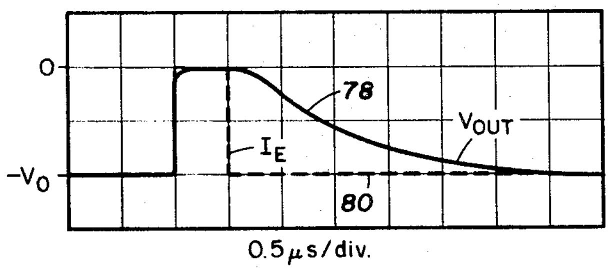
FIG. 12 is a plot of the output waveform of the circuit of FIG. 10 when operated in another mode.

The schematic circuit diagram of FIG. 10 illustrates how the operation of the interfacing stage in accordance with the present invention can be increased. The stray capacitance of the stage is represented by capacitor $C_S$. A speedup capacitor $C_E$ can be connected in parallel with the input resistor $R_E$ by means of a switch 72. When the switch 72 is open, as illustrated in FIG. 10, and the speedup capacitor $C_E$ is not connected in the circuit, an output voltage as represented by curve 74 in FIG. 11 results from an input current pulse represented by curve 76. When the switch 72 is closed to connect capacitor $C_E$ in the circuit, the output voltage represented by curve 78 in FIG. 12 is produced in response to an input current as represented by curve 80. In the test circuit, the load resistor $R_L$ was 100,000 ohms and the speedup capacitor $C_E$ had a value of 500 pico-farads. The switching time improved by at least a factor of three. The long turnoff time is caused by the large stray capacitance $C_S$ of the device and the value of the load resistor $R_L$. This can be optimized by adjusting the gate voltage on the MOS transistor used for the load resistor $R_L$ in the circuit 60, for example. However, even with delay times from 100 to 400 nanoseconds, the interfacing stage can be used in digital circuits exceeding 1.0 MHz.

Figures 3, 4, 13:
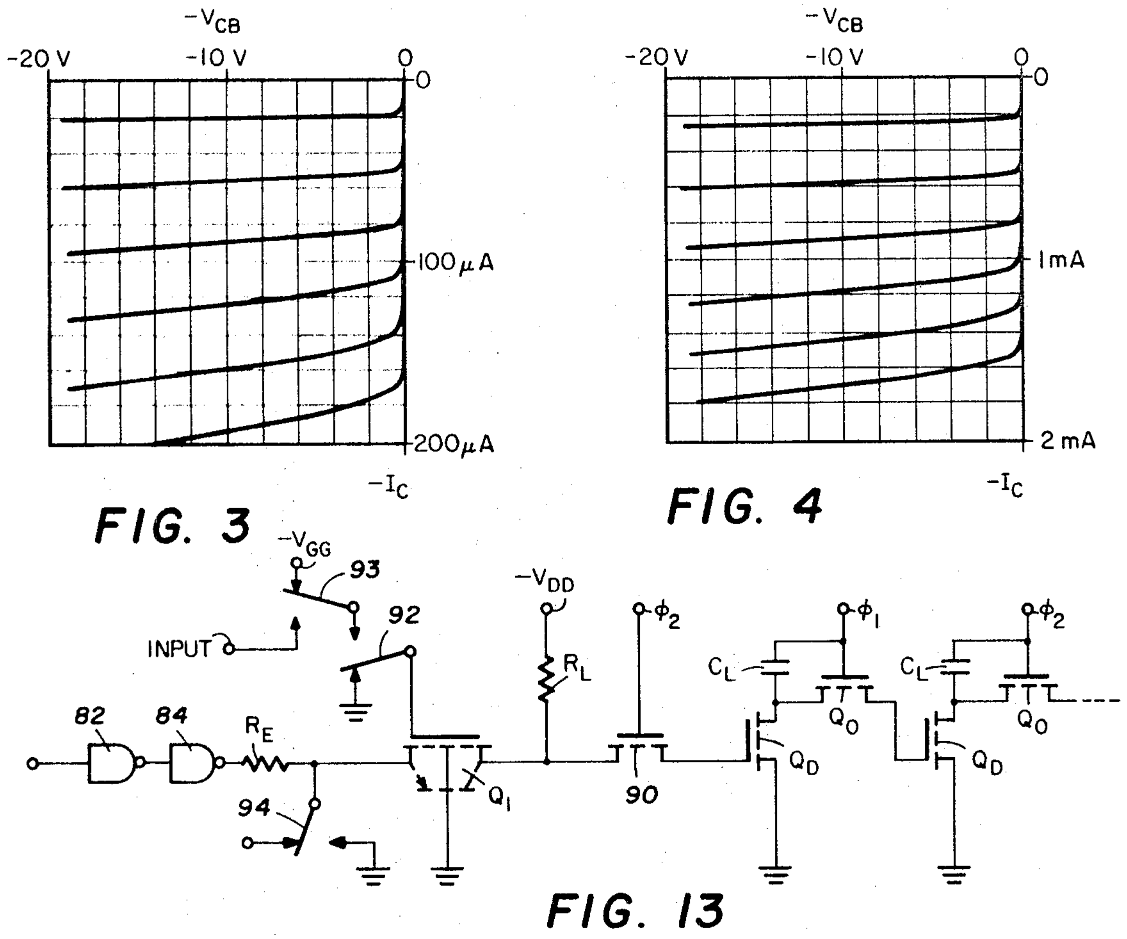
FIGS. 3 and 4 are plots of collector-base voltages with respect to collector current which illustrate the current voltage characteristics of a surface-oriented bipolar transistor such as illustrated in FIG. 2.
FIG. 13 is a schematic circuit diagram illustrating how the interface stage in accordance with the present invention may be utilized.

FIG. 13 illustrates how the interfacing stage in accordance with the present invention can be used to transfer positive logic levels form standard $I^2L$ NAND-gates 82 and 84 of the SN 5,400 series manufactured by Texas Instruments Incorporated to a 64 bit MOS shift register of the type described in copending U.S. Pat. application Ser. No. 685,238, entitled "-High Speed, Low Power, Dynamic Shift Register With Synchronous Gates," filed on Nov. 17, 1967, on behalf of Robert H. Crawford and assigned to the assignee of this invention. The two integrated circuit ships were coupled by an external resistor $R_E$. Transistor $Q_1$ of the interfacing stage and load transistor $Q_L$ were fabricated on the same substrate as the shift register using the same processing steps. Only a transfer MOS transistor 90 and the first bit of the shift register are illustrated.

The first bit of the shift register is comprised of two identical stages, each stage being comprised of a driver transistor $Q_D$, a capacitor $C_L$, and an output transistor $Q_O$. The drain of driver transistor $Q_D$ is coupled through capacitor $C_L$ to a negative going pulsed voltage source $\Phi_1$. Source $\Phi_1$ is also connected to the gate of output transistor $Q_O$. The source of driver transistor $Q_D$ is grounded, and the gate is connected of to the source of transfer transistor 90. Output transistor $Q_O$ connects the drain of transistor $Q_D$ to the input of the second stage of the first bit, which is the gate of transistor $Q_D$. The second stage is identical to the first stage, except that the drain of transistor $Q_D$ is coupled through capacitor $C_L$ to a second negative going pulsed voltage source $\Phi_2$ which is nonconcurrent with the pulsed voltage source 100 ,.

Assume now that the logic output from gate 84 is the high-positive voltage, typically about +3.3 volts, representative of a logic "1." This voltage will result in emitter current in transistor $Q_1$, causing the collector-base junction to conduct. The voltage drop across resistor $R_L$ resulting from this current will then cause the output to approach ground potential. During the voltage pulse from source $\Phi_2$, transfer transistor 90 is turned "on" so that the gate of driver transistor $Q_D$, which is the logic input of the first stage of the first bit, also approaches ground, which is the more positive logic level of about −2.0 volts which is usually selected as being representative of a logic "1." Then during the negative voltage pulse from source $\Phi_1$, driver transistor $Q_D$ is turned "off" and the drain of driver $Q_D$ goes negative as a result of the negative charge through capacitor $C_L$. As the output transistor $Q_O$ is turned "on" by the negative going pulse, the gate of driver transistor $Q_D$ of the second stage is charged negatively. This negative charge is held after the pulse from source $\Phi_1$ has terminated because transistor $Q_O$ turns "off."

Then during the next negative going pulse from source $\Phi_2$, transistor $Q_D$ of the second stage is turned "on" by the negative charge stored on the gate. As a result, the drain of transistor $Q_D$ of the second stage remains near ground potential as transistor $Q_O$ is turned "on", and the gate of the driver transistor $Q_D$ of the next bit remains near ground potential, which it will be noted is the same logic level originally applied at the control gate of transistor $Q_D$ of the first bit. Thus, the logic "1" level represented by −2.0 volts has been transferred through the first bit during one period, which includes a pulse from source $\Phi_1$ and a pulse from source $\Phi_2$.

On the other hand, if the logic level from NAND-gate 84 is the low level approaching ground of about +0.2 volt which typically represents logic "0," the emitter of transistor $Q_1$ will not be forward biased and transistor $Q_1$ will remain "off." As a result, the collector of transistor $Q_1$ approaches the drain voltage $-V_{DD}$ which is typically representative of logic "0" in MOS logic circuits. Then during the negative going pulse from source $\Phi_2$, the gate of driver transistor $Q_D$ of the first transistor 90 to a stage of the first bit is charged negatively through transistor 90 to a level of about −12.0 volts. Then during the first negative pulse from source $\Phi_1$, transistor $Q_D$ of the first stage turns "on," thus discharging the gate of the driver transistor $Q_D$ of the second stage to a voltage level near ground. Then during the next negative pulse from source $\Phi_2$, driver transistor $Q_D$ of the second stage remains "off", thus charging the gate of the first stage of the next bit negatively to about −12.0 volts, which it will be recalled is the logic "0" level applied to the gate of driver transistor $Q_D$ of the first stage.

Thus, it will be noted that the more positive logic level from the bipolar NAND-gate 84 is transferred to the logic input of the first bit of shift register as the more positive logic level for the MOS shift register. The most positive level from the NAND-gate 84 is typically about +3.3 volts, while the most positive logic level within the MOS shift register is typically about −2.0 volts. On the other hand, the more negative voltage level at the output of NAND-gate 84 is typically about +0.2 volt, and this level is translated to a level of about −12.0 volts at the gate of transistor $Q_D$ of the first stage of the first bit of the shift register by the interfacing state.

The transistor $Q_1$ may be used for other functions when provided with a conventional gate electrode as illustrated in FIG. 13. In such an instance, the transistor $Q_1$ may function either as a bipolar transistor, or as an MOS field effect transistor. When the transistor $Q_1$ is used as a bipolar-to-MOS interface, it can also be used to provide an inhibit function merely by switching the gate from ground to a negative voltage supply $-V_{GG}$, as represented by switches 92 and 93. This function was previously described in connection with FIGS. 7–9.

If desired, the same transistor device $Q_1$ can be used as a logic input for the negative logic levels from another MOS device. This is achieved merely by connecting the source of transistor $Q_1$ to ground, as represented by switch 94, and connecting the gate to the MOS logic input, as represented by switches 92 and 93. Then when the MOS input is at the more positive voltage level approaching ground, transistor $Q_1$, which is then an MOS transistor, is turned "off". When transistor 90 is turned "on" by the voltage pulse from source $\Phi_2$, the gate of transistor $Q_D$ of the first stage of the shift register bit will be charged negatively to about −12.0 volts. On the other hand, if the MOS input is at the most negative logic level, MOS transistor $Q_1$ will be turned "on", thus clamping the gate of transistor $Q_D$ to a voltage approaching ground while transfer transistor 90 is turned "on." Thus, it will be noted that the MOS transistor $Q_1$ functions as an inverter stage for MOS logic inputs.

Although preferred embodiments of the invention have been described in detail it is to be understood that various changes, substitutions, and alterations can be made therein without departing from the spirit and scope of the invention as defined by the appended claims.

What is claimed is:

1. A bipolar-to-MOSFET interface stage integrated circuit for shifting a voltage of one polarity of a bipolar-logic circuit to an input voltage of the opposite polarity of a MOSFET-logic circuit comprising:

a. a semiconductor substrate of one conductivity type having a plurality of laterally spaced semiconductor regions formed in one surface thereof, b. two of said regions forming source and drain regions of an insulated gate field effect transistor, said transistor having a channel between said two regions and a gate electrode formed over and insulated form said channel, c. a pair of said semiconductor regions forming a collector and emitter regions of a lateral bipolar transistor having a base region therebetween, d. said semiconductor region comprising said source of said field effect transistor and said semiconductor region comprising said collector of said bipolar transistor being the same, and bipolar e. circuit means for shifting a voltage of one polarity of the bipolar transistor to an input voltage of the opposite polarity of the field effect transistor by applying said one polarity voltage to the emitter region of the bipolar transistor, the base of which is connected to ground, and taking said voltage of the opposite polarity as the output at the collector region.

2. The circuit defined in claim 1 wherein the semiconductor chip is N-type and the emitter, collector, source and drain regions are P-type 3. The circuit defined in claim 1 wherein the emitter and collector regions are spaced diffusions in a semiconductor ship and the semiconductor chip forms the base region.

4. The circuit defined in claim 3 further characterized by a control gate extending between the emitter and collector regions to form an MOS transistor as well as a bipolar transistor.

* * * * *